(12) United States Patent
Zhang et al.

(10) Patent No.: US 11,587,789 B2
(45) Date of Patent: Feb. 21, 2023

(54) SYSTEM AND METHOD FOR RADICAL AND THERMAL PROCESSING OF SUBSTRATES

(71) Applicant: Applied Materials, Inc., Santa Clara, CA (US)

(72) Inventors: Xinming Zhang, Santa Clara, CA (US); Abhilash J. Mayur, Salinas, CA (US); Shashank Sharma, Fremont, CA (US); Norman L. Tam, Cupertino, CA (US); Matthew Spuller, Belmont, CA (US); Zeqiong Zhao, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

(21) Appl. No.: 17/123,386

(22) Filed: Dec. 16, 2020

(65) Prior Publication Data
US 2021/0280418 A1   Sep. 9, 2021

Related U.S. Application Data

(60) Provisional application No. 62/986,517, filed on Mar. 6, 2020.

(51) Int. Cl.
*H01L 21/02* (2006.01)
*H01L 27/11556* (2017.01)
(Continued)

(52) U.S. Cl.
CPC .. *H01L 21/02667* (2013.01); *H01L 21/02238* (2013.01); *H01L 21/02252* (2013.01);
(Continued)

(58) Field of Classification Search
CPC ......... H01L 21/02667; H01L 21/02238; H01L 21/02252; H01L 21/3003; H01L 27/11556; H01L 21/02164; H01L 21/02532
See application file for complete search history.

(56) References Cited

U.S. PATENT DOCUMENTS 7,393,723 B2    7/2008 Yamazaki et al.
2007/0123012 A1*  5/2007 Walther .............. H01L 21/3003
                                          438/510
(Continued)

OTHER PUBLICATIONS

K. Pangal, et al., "Hydrogen Plasma Enhanced Crystallization of Hydrogenated Amorphous Silicon Films", Journal of Applied Physics 85, 1900 (1999); https://doi.org/10.1063/1.36982, Jan. 15, 1999.
(Continued)

*Primary Examiner* — Julia Slutsker
(74) *Attorney, Agent, or Firm* — Patterson + Sheridan, LLP

(57) ABSTRACT

The present disclosure provides systems and methods for processing channel structures of substrates that include positioning the substrate in a first processing chamber having a first processing volume being in fluid communication with a plasma source. The substrate can include a channel structure with high aspect ratio features having aspect ratios greater than about 20:1. The method can also include forming an oxide cap layer over a silicon-containing layer of the channel structure and exposing the oxide cap layer to a hydrogen-or-deuterium radical to nucleate the silicon-containing layer of the channel structures of the substrate. Forming the oxide cap layer and exposing the channel structure with the hydrogen radical occurs in the first processing chamber to form a nucleated substrate. The method can also include positioning the nucleated substrate in a second processing chamber with a second processing volume and heating the nucleated substrate in the second processing chamber.

18 Claims, 8 Drawing Sheets

(51) Int. Cl.
 H01L 21/30 (2006.01)
 H01L 27/11582 (2017.01)
(52) U.S. Cl.
 CPC .... *H01L 21/3003* (2013.01); *H01L 27/11556* (2013.01); *H01L 21/02164* (2013.01); *H01L 21/02532* (2013.01); *H01L 27/11582* (2013.01)

(56) References Cited

U.S. PATENT DOCUMENTS

| | | | | |
|---|---|---|---|---|
| 2017/0186642 | A1* | 6/2017 | Kim | H01L 21/02362 |
| 2019/0013404 | A1* | 1/2019 | Carlson | H01L 29/2003 |
| 2019/0348282 | A1* | 11/2019 | Takeshima | H01L 21/32138 |
| 2021/0082724 | A1* | 3/2021 | Xie | H01J 37/32422 |

OTHER PUBLICATIONS

Saravanapriyan Snraman et al., "Mechanism of Hydrogen-Induced Crystallization of Amorphous Silicon", Department of Chemical Engineering, University of California, Santa Barbara, CA, 2002.
H.P. Zhou et al., "Hydrogen-Plasma-Induced-Rapid, Low-Temperature Crystallization of um-thick a-Si:H Films", Sep. 7, 2016 Scientific Reports, www.nature.com/scienificreports.

* cited by examiner

SYSTEM AND METHOD FOR RADICAL AND THERMAL PROCESSING OF SUBSTRATES

CROSS-REFERENCE TO RELATED APPLICATIONS

This application claims benefit of U.S. Provisional Patent Application Ser. No. 62/986,517, filed Mar. 6, 2020, which is herein incorporated by reference.

BACKGROUND

Field

Embodiments of the present disclosure generally relate to systems and methods of manufacturing a semiconductor device. More particularly, the present disclosure is directed to systems and methods of thermally processing channel structures in semiconductor devices under a hydrogen radical environment.

Description of the Related Art

The integrated circuit (IC) market is continually demanding greater memory capacity, faster switch speeds, and greater feature density. In order to enable fabrication of next generation devices and structures, three dimensional (3D) stacking of semiconductor memory chips are often used to improve performance of the transistors. By arranging transistors in three dimensions instead of conventional two dimensions, multiple transistors may be placed in the integrated circuits very close to each other. Three dimensional stacking of semiconductor chips reduces wire lengths, keeps wiring delay low and increases area device density on the chip. When forming flash memory structures, a film stack is disposed on a substrate and an etch process is performed to etch a trench in the film stack. The trench is later used to build a silicon channel structure to electrically communicate between a source and a drain structure formed nearby. The film stack typically includes repeated alternating layers of conductive layers and insulating layers. Due to the requirement of the high number of the repeatedly alternating layers in the film stack for higher device performance, the film stack with channel structures often have high aspect ratios. Moreover, manufacturers are continuously increasing the height of the stacks which increases the length of the channel. The speed of the device becomes limited by the mobility of electrons in the channel and the increased lengths that the electrons must travel.

In order to increase the mobility of electrons in the channel, conventional methods use thermal annealing alone to crystallize and grow semiconductor grains to aid electron mobility. Such processes, however, are not ideal because annealing alone causes high thermal budgets which include running at high temperatures for long residence times. Temperature is often limited because exceeding certain temperatures can cause defects in the device. Moreover, extending residence times can affect throughput. If residence time and/or temperature is inadequate, then grain sizes do not grow to an adequate level and can produce devices with poor performance.

In view of the above, there is a need for systems and methods for thermally processing a substrate having high aspect ratio features.

SUMMARY

In an embodiment, a method of processing a substrate is provided that includes positioning the substrate in a first processing chamber having a first processing volume being in fluid communication with a remote plasma source. The substrate can include a 3D memory structure with high aspect ratio features having aspect ratios greater than about 20:1, such as from about 20:1 to about 1000:1, such as from about 50:1 to about 500:1, such as from about 100:1 to about 300:1. A silicon-containing layer of the substrate is exposed to an oxygen plasma to form an oxide cap layer in the first processing volume. The method also includes exposing the channel structure comprising the oxide cap layer to a hydrogen-or-deuterium plasma in the first processing volume to nucleate the amorphous layer of the channel structure. The substrate is annealed in the first processing volume at a temperature of about 100° C. to about 1100° C. to form a nucleated substrate. The nucleated substrate is positioned in a second processing chamber with a second processing volume and heated in the second processing volume.

In another embodiment, a method of making a memory device on a substrate is provided that includes forming a channel structure in a film stack by etching a channel hole in the film stack and placing a channel layer in an inner surface and bottom of the channel hole, the channel structure in the film stack forming high aspect ratio features on the substrate, the high aspect ratio features having aspect ratios greater than about 20:1, such as from about 20:1 to about 1000:1, such as from about 50:1 to about 500:1, such as from about 100:1 to about 300:1. An oxide cap layer is formed over the channel layer of the channel structure. The high aspect ratio features comprising the oxide cap layer is treated with a hydrogen radical in a first processing volume of a first processing chamber with a temperature of about 100° C. to about 1100° C. The high aspect ratio features are heated at a temperature of about 400° C. to about 1100° C. in a second processing volume of a second processing chamber.

In another embodiment, a method of processing a substrate is provided including forming a silicon-containing layer over a substrate. An oxide cap layer is formed over the silicon-containing layer by exposing the silicon-containing layer to an oxygen plasma (e.g., oxygen radical). The oxide cap layer is exposed to hydrogen radical. The substrate is heated at a first temperature of about 100° C. to about 1100° C. to form a nucleated substrate. The nucleated substrate is further heated at a second temperature, such as in a furnace.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
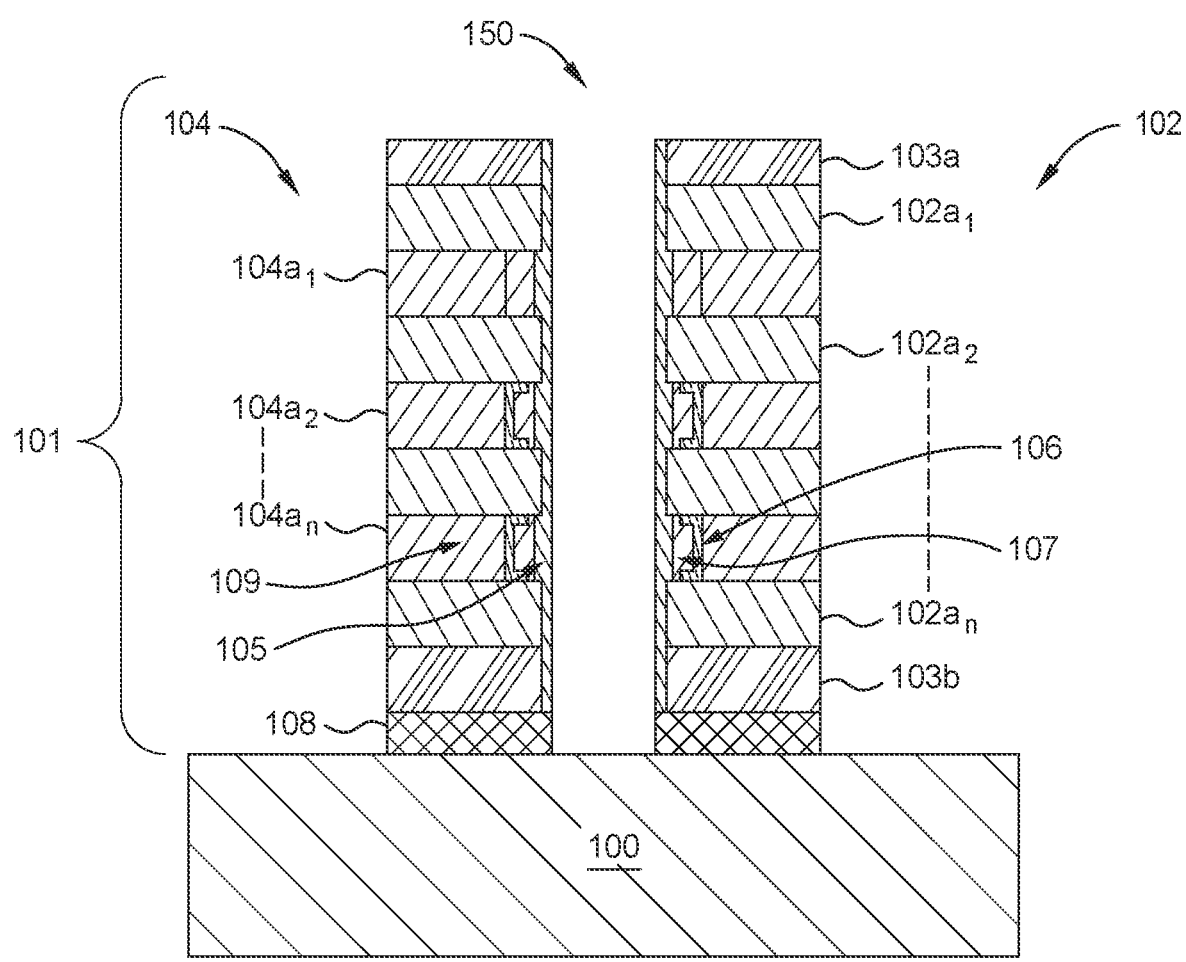
FIG. 1A depicts an example channel hole formed in a film stack disposed on a substrate in accordance with certain aspects of the present disclosure.

Certain aspects of the present disclosure provide systems and methods for thermally processing substrates with high aspect ratio features. In particular, high aspect ratio features can be channel layers that are formed in certain three dimensional devices. As vertical structures are created with increasingly long channel lengths, the speed of the device can become limited by the mobility of electrons in the channel and the increased lengths that the electrons must travel. Thus, there is a need to increase the mobility of electrons in the semiconductor channel in order to compensate for the increasing length that the electrons must travel. In particular, increasing grain sizes of the semiconductor, such as silicon in the channel, using thermal annealing processes can help reduce electron scattering at semiconductor grain boundaries and therefore increase mobility of electrons.

Annealing creates a more crystalline structure from regions of the substrate that were previously made amorphous. During crystallization process, semiconductor atoms, such as silicon atoms, rearrange into ordered lattice structures. In order to crystalize an amorphous semiconductor film, heat is generally used as an energy source to provide atoms with necessary kinetic energy to rearrange the atoms into an ordered structure. To increase the grain size obtained from amorphous semiconductor films, furnace temperature can be increased or/and furnace anneal time can be increased. Furnace temperature is greatly limited due to tighter requirement of processing thermal budget, while increased furnace anneal time can harm throughput of the product. In view of the above, there is a need for systems and methods for processing a semiconductor substrate having film stacks with high aspect ratio channel structures to provide uniform and enlarged grain size in the channel with a method of high throughput and minimum thermal budget in order to offer increased performance of the device in an efficient manner. The present disclosure provides for systems and methods for thermally processing substrates having high aspect ratio features in order to produce high performance devices.

In particular, the processes and systems of the present disclosure improve electron mobility within channels of three-dimensional memory structures by increasing the average grain size within a semiconductor channel layer disposed in the channel hole. The process includes forming an oxide cap layer over the substrate and then treating the substrate with a radical species, such as hydrogen or deuterium radicals, under increased temperature conditions to promote an environment that facilitates nucleation and grain growth of the semiconductor channel layer. The radical treatment, such as hydrogen or deuterium doping, can be followed by furnace annealing at temperatures equal or higher than the radical treatment to promote grain growth of the nucleated semiconductor channel layer. Furnace annealing of the nucleated channel layer results in a more uniform grain distribution within the semiconductor channel layer and further grain growth. The hydrogen or deuterium radical treatment enables decreases of the activation energy required for nucleation and incubation stage of semiconductor grains and reduces the amount of heat and time necessary during furnace annealing. It has been further discovered that oxide capping using an oxygen plasma treatment of the channel layer prior to the hydrogen or deuterium radical treatment enables grain size growth improvement and reduces potential etching of the silicon-containing layer from the hydrogen or deuterium radicals.

Figure 1B:
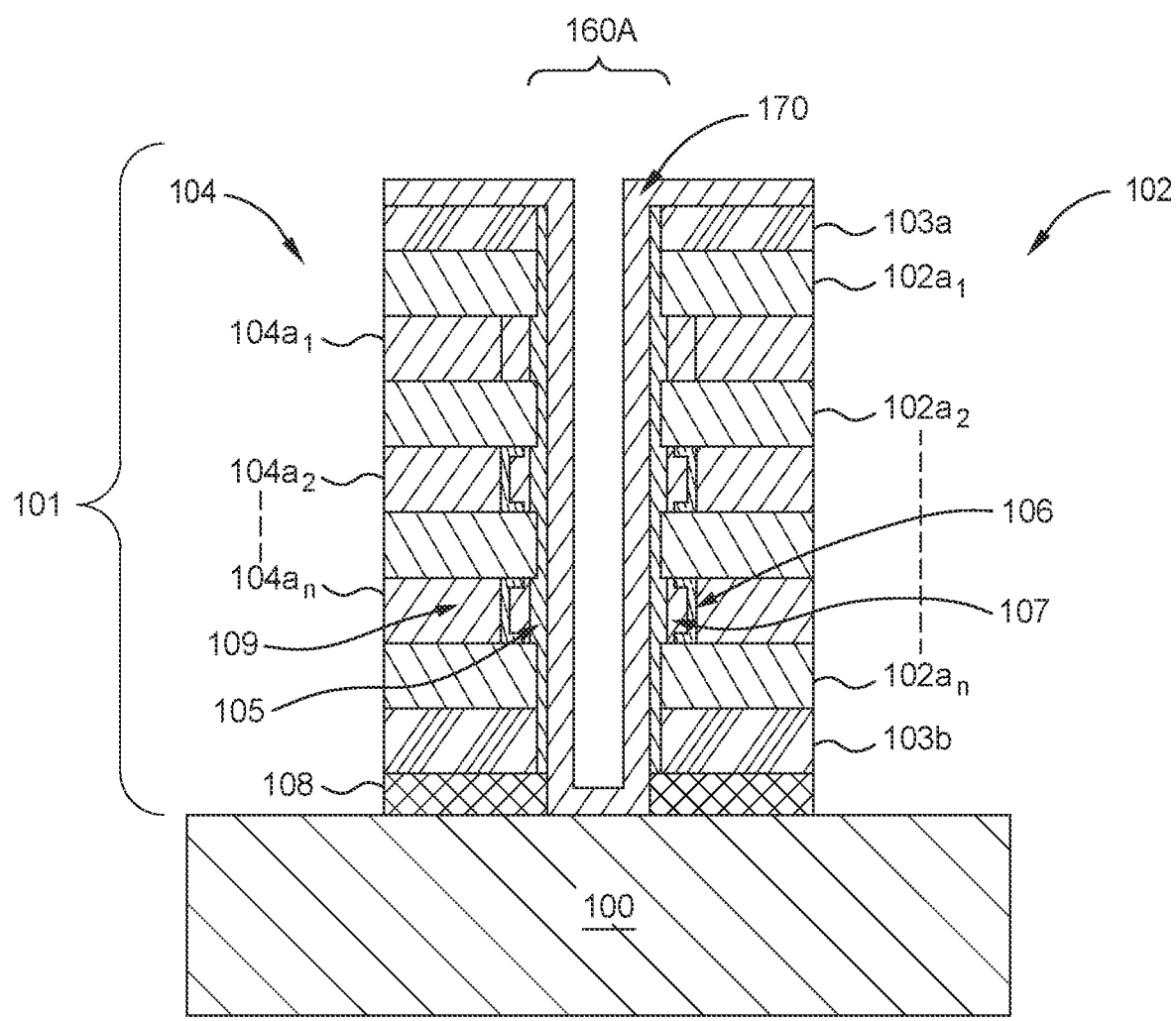
FIG. 1B depicts an example channel structure with a channel layer disposed inside the channel hole of a memory structure formed on a substrate in accordance with certain aspects of the present disclosure.
Figure 1C:
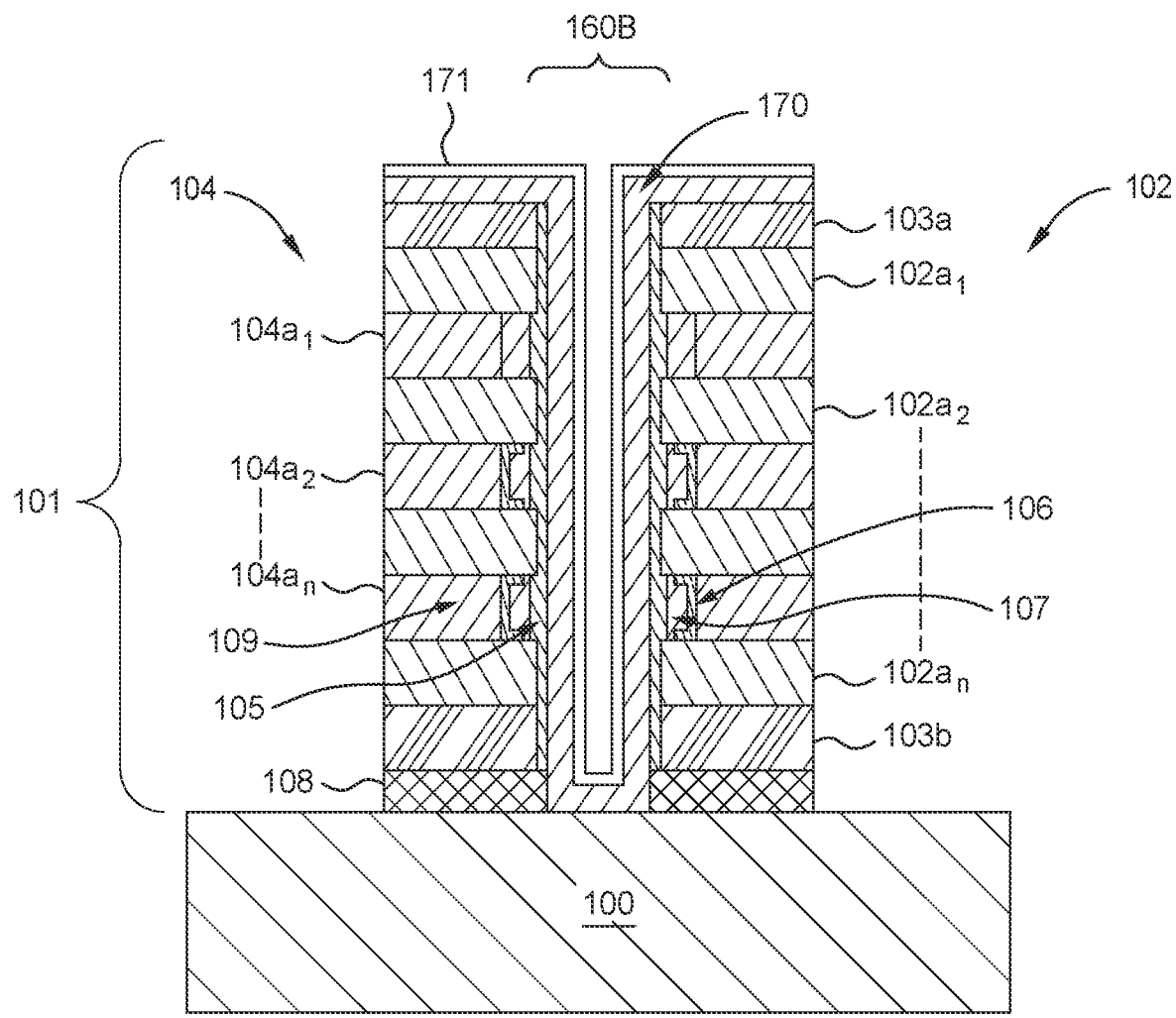
FIG. 1C depicts a channel structure with an oxide cap layer in accordance with certain aspects of the present disclosure.

FIG. 1A, FIG. 1B, and FIG. 1C depict memory structures 110 formed on a substrate 100 at various stages of formation in accordance with certain aspects of the present disclosure. As shown in an example embodiment depicted in FIG. 1A, FIG. 1B, and FIG. 1C, the substrate 100 has a substantially planar surface, but may alternatively have an uneven surface, or a substantially planar surface having a structure formed thereon. A film stack 101 is disposed on the substrate 100 that is used to form memory cell structures in the film stack 101. The manufacturing process of a 3D NAND device starts with depositing multiple alternating film layers, which are collectively referred to as a "film stack". Creating the film stack includes depositing multiple, thin layers of an oxide/nitride (ON) pair of layers or an oxide/polysilicon (OP) pair of layers. The substrate 100 is a silicon based material, but may also be a germanium based material, a silicon-germanium alloy, or any suitable insulating materials, semiconductor materials or conductive materials, such as a material with a periodic group III, IV or V element. In some embodiments, the substrate 100 can be a material such as doped or undoped single crystalline silicon, silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 100 can have various dimensions, such as about 200 mm, about 300 mm, about 450 mm, or other diameter substrates, as well as, rectangular or square panels.

In at least one embodiment, the film stack 101 disposed on the substrate 100 has a number of vertical stacked layers, such as 34 pairs of layers or more. The film stack 101 includes pairs of layers including a first layer 102 (shown from $102a_1$ to $102a_n$) and a second layer 104 (shown from $104a_1$ to $104a_n$) that alternate and are sandwiched between two nitride layers 103a and 103b. The sandwiched layers are stacked on an aluminum oxygen compound layer 108 disposed on the substrate to form the film stack 101. The pairs of layers include alternating first layer 102 and second layer 104 repeatedly for n number of pairs of the first layers and the second layers. The film stack 101 is part of a memory cell device, such as a three-dimensional (3D) memory device and any predetermined number of repeating pairs of the first and second layers 102, 104 can be used as needed.

In at least one embodiment, which may be combined with other embodiments, the film stack 101 is used to form multiple memory cell structures for a three-dimensional (3D) memory device. The film stack 101 is composed of alternating oxide and nitride layers (ON) or of alternating oxide and polysilicon layers (OP). For example, the film stack 101 can include polycrystalline silicon, silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. As can be seen in FIG. 1A, FIG. 1B, and FIG. 1C, the alternating layers of the film stack 101 include first layers 102, which function as insulating dielectric layers, such as silicon oxide. The alternating layers of the film stack 101 also include second layers 104, which are functional layers within which memory storage cells are built. The functional layers include one or more of silicon, poly silicon, and silicon nitride.

The second layers 104 include memory store cells of different structures, such as a charge-trap device (not shown), or a floating gate device. The floating gate device includes a control gate 109, an interpoly dielectric (IPD) layer 106, a floating gate 107, a tunnel oxide layer 105, and a channel layer 170. The floating gate is composed of silicon and the tunnel oxide layer is composed of silicon oxide. However, other materials are also contemplated. The IPD layer 106 is a stack of layers, such as stack of three layers. The IPD layer 106 is a stack of one or more of a silicon oxide layer, a silicon nitride layer, and a silicon oxide layer. The alternating first layers 102 and second layers 104 are disposed between nitride layers (e.g. 103a, 103b), such as between a cap layer 103a and a stop layer 103b.

The film stack 101 is patterned to form a channel hole 150 therein, as shown in FIG. 1A. A hardmask layer (not shown in drawings) is formed on the film stack 101 to facilitate forming channel holes 150 in the film stack 101. The channel holes 150 are used to form channel structures 160A, 160B in the device structure when the manufacturing process is done. Channel structures 160A, as used herein include the channel hole 150 and channel layer 170. Channel structures 160B include the channel hole 150, channel layer 170, and oxide cap layer 171. It is noted that the device structures and configurations can be varied as needed for different device performance requirements.

The patterning process includes forming a channel hole 150, shown in FIG. 1A, in the film stack 101, which is later used as a channel structure 160A, 160B, shown in FIG. 1B and FIG. 1C. The patterning process uses any suitable patterning gas mixture to etch the first and the second layers 102, 104 in the film stack 101. The channel layer 170 is formed in the channel hole 150 to form the channel structure 160A. The channel layer 170 is formed in the inner surface of the channel hole, along the entire length of the channel hole, and at the bottom of the channel hole. The channel layer 170 is formed by a chemical vapor deposition (CVD) process, but may alternatively be formed by atomic layer deposition (ALD) process, sputtering process, coating process, or other suitable processes. The channel layer 170 is amorphous after deposition and crystallized into poly-Si after hydrogen or deuterium radical treatment, and may additionally or alternatively include single crystal silicon, group III-V semiconductors or other semiconductors with high electron mobility and low random telegraph noise. The channel layer 170 is crystallized to increase conductivity of the channel structure 160A, 160B and enhance overall device performance. The channel hole 150 formed in the film stack 101 can have a sloped sidewall (e.g., non-perpendicular or angled relative to the horizontal surface or plane of the substrate 100) during the patterning and etching process. Prior to the hydrogen or deuterium radical treatment, an oxide cap layer 171 is formed over the channel layer 170, as shown in FIG. 1C. An additional oxide layer (not shown) can fill the remaining space in the channel structure 160B after the channel layer 170 and oxide cap layer 171 is placed and after thermally treating the channel structure 160B, according to the methods of the present disclosure.

In at least one embodiment, which may be combined with other embodiments, the substrate of the present disclosure includes high aspect ratio features. For example, the channel hole 150 formed in the film stack 101 can be referred to as a high aspect ratio feature. High aspect ratio features have aspect ratios above about 20:1, 30:1, 40:1, or 50:1, such as from 50:1 to about 1000:1, such as about 50:1 to about 300:1, such as about 100:1 to about 300:1, or about 200:1 to about 300:1.

Although a 3D NAND structure is depicted in FIGS. 1A, 1B, and 1C, the methods of the present disclosure can be applied to any semiconductor device with channel structures such as resistive RAM (ReRAM), and 3D-DRAM.

Figure 2:
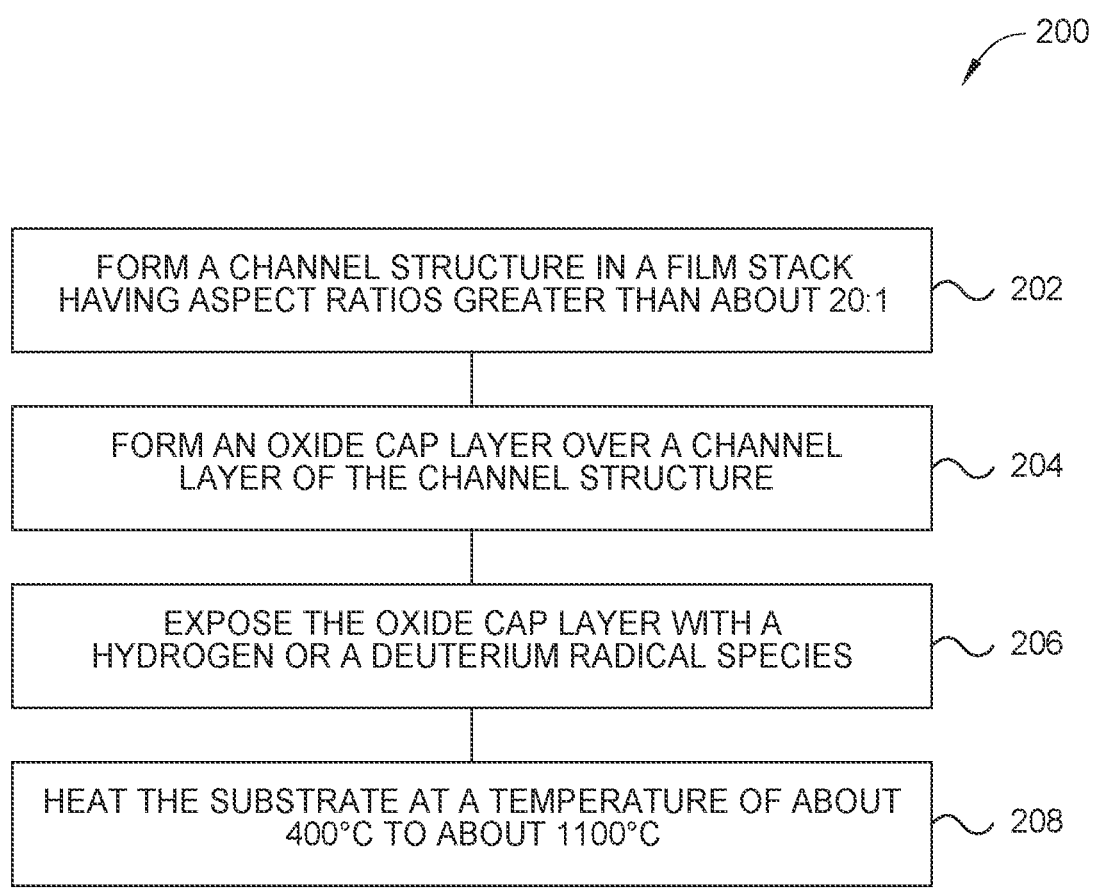
FIG. 2 depicts a flow diagram of an example method for making a memory device on a substrate in accordance with certain aspects of the present disclosure.

FIG. 2 depicts a flow diagram of an example method 200 for making a memory device on a substrate in accordance with certain aspects of the present disclosure. Operation 202 of the method 200 includes forming a channel structure 160A in a film stack 101. The channel structure 160A is formed by etching a channel hole 150 in the film stack 101 and forming a channel layer 170 in an inner surface and bottom of the channel hole 150 of the film stack 101. The channel layer 170 is about 100 Angstroms to about 200 Angstroms. The method 200 includes, in operation 204, forming an oxide cap layer 171 over the high aspect ratio features. The oxide cap layer 171 is formed over the channel layer 170. The oxide cap layer 171 is formed by exposing the channel layer 170 to oxygen plasma (e.g., oxygen radicals). The channel layer 170 is exposed to the oxygen plasma in a first processing volume (e.g., 308 shown in FIG. 3 and FIG. 4) of a first processing chamber (e.g., 328 shown in FIG. 3 and FIG. 4). The channel structure 160B forming a high aspect ratio feature having aspect ratios above about 20:1. The oxide cap layer 171 is about 2 Angstroms to about 50 Angstroms, such as about 2 Angstroms to about 4 Angstroms, or about 20 Angstroms to about 40 Angstroms. In some embodiments, which can be combined with other embodiments described herein, a oxide cap layer thickness of the oxide cap layer is about 10% to about 50% of a channel layer thickness of the channel layer 170.

In operation 204, the substrate is maintained or heated to a temperature of about 70° C. to about 650° C. for about 10 seconds to about 10 minutes, such as about 30 seconds to about 5 minutes. The oxygen plasma is formed by introducing about 0.05 SLM to about 10 SLM oxygen gas, such as about 1 SLM to about 5 SLM oxygen gas to the first processing volume 308. The oxygen gas is introduced to the first processing volume with hydrogen gas at about 0 sccm to about 1 SLM, such as about 50 sccm. $H_2O$ vapor is introduced to the first processing volume at about 0 sccm to about 100 sccm. Operation 204 further includes a process volume pressure of about 0.05 Torr to about 10 Torr, such as about 1 Torr to about 2 Torr.

Figure 3:
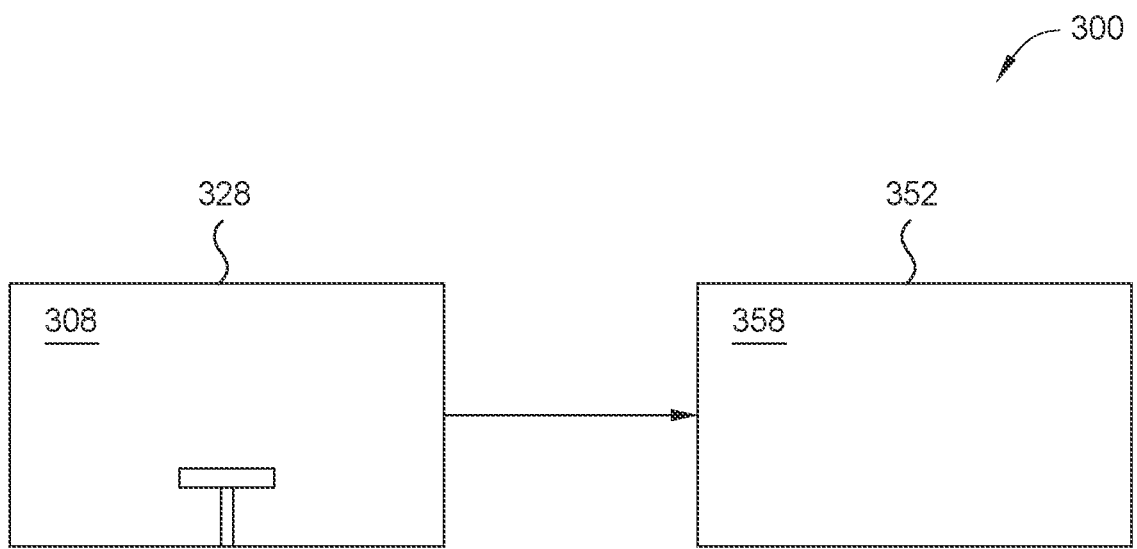
FIG. 3 depicts a schematic of an example thermal processing system used to treat a channel structure on a substrate in accordance with certain aspects of the present disclosure.
Figure 4A:
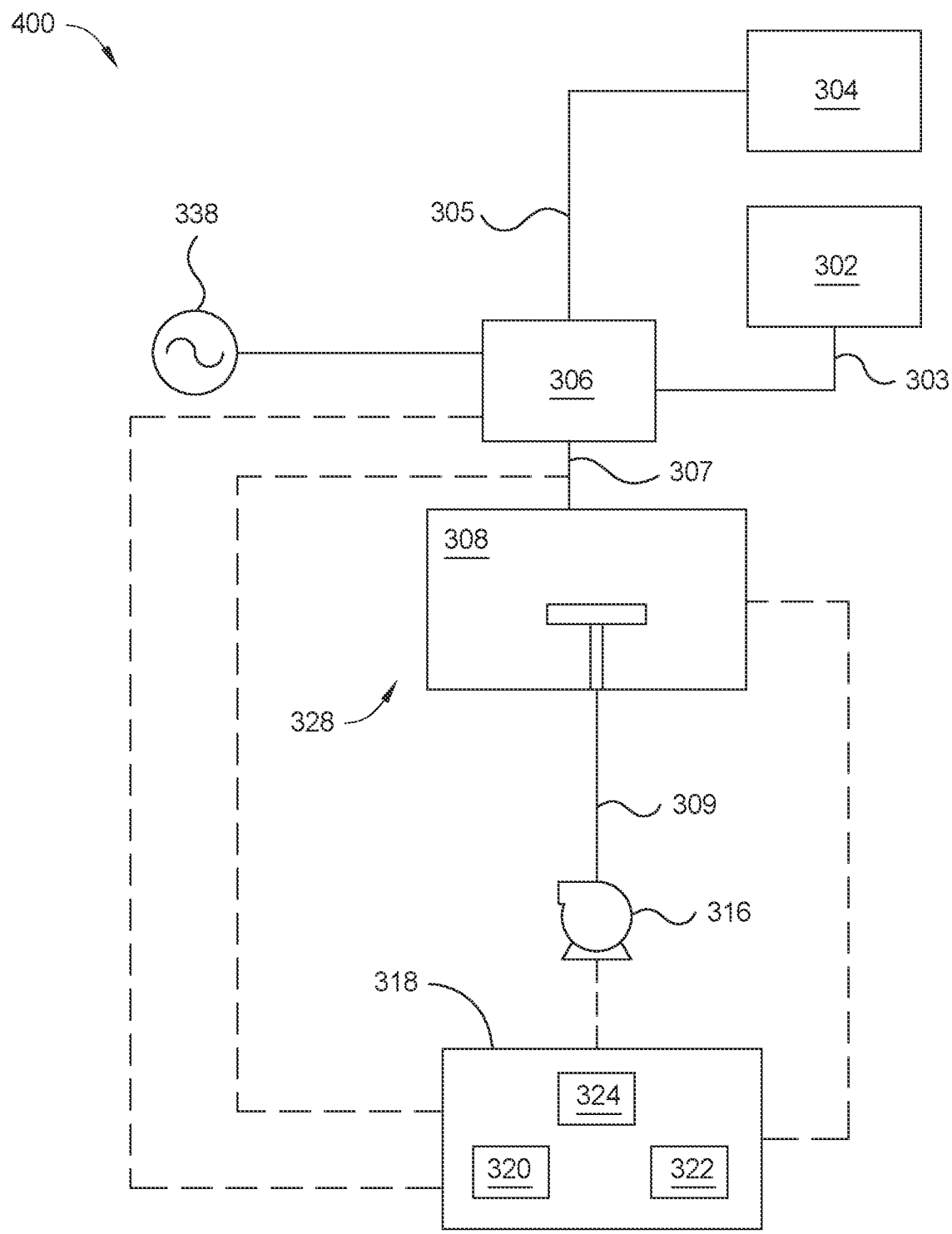
FIG. 4A and FIG. 4B depict schematics of example thermal pre-processing systems used to heat and treat a channel structure on a substrate with a radical species in accordance with certain aspects of the present disclosure.
Figure 4B:
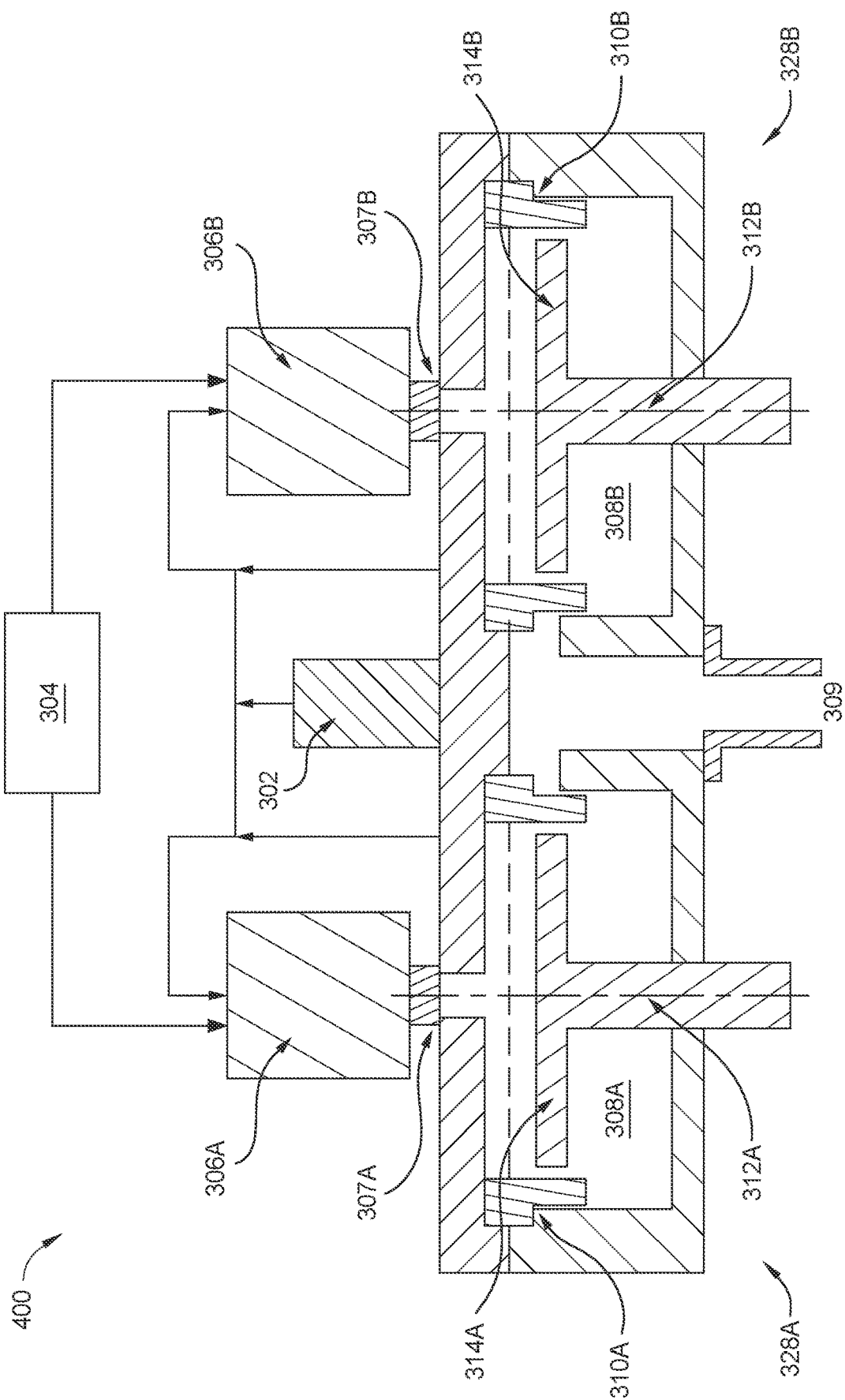

In operation 206 of method 200, the high aspect ratio features of the channel structure are exposed to a hydrogen or deuterium radical species in the first processing volume (e.g., 308 shown in FIG. 3 and FIG. 4) of the first processing chamber (e.g., 328 shown in FIG. 3 and FIG. 4). Forming the oxide cap layer in operation 204 occurs in the same chamber as exposing the channel structure with hydrogen or deuterium radical species in operation 206. Alternatively, forming the oxide cap layer in operation 204 occurs in a different chamber as exposing the channel structure with hydrogen or deuterium radical species in operation 206. In some embodiments which may be combined with other embodiments, at operation 206, the first processing chamber (e.g., 328 shown in FIG. 3 and FIG. 4) is heated at a temperature of about 100° C. to about 1100° C., such as about 200° C. to about 800° C., such as about 300° C. to about 700° C., about 400° C. to about 600° C., such as about 500° C. In at least one embodiment which may be combined with other embodiments, the substrate having high aspect features, is exposed to the hydrogen or deuterium radical species for at least about 1 minute, such as about 1 minute to 30 minutes, alternatively about 10 minutes to about 1 hour, such as about 20 minutes to 40 minutes, such as about 30 minutes. Treating the high aspect ratio features with the hydrogen or deuterium radical species at temperatures described above can be done in a thermal pre-processing system 400 described with reference to FIG. 4A and FIG. 4B. However, the use of other thermal processing systems is also contemplated.

Referring back to FIG. 2, operation 208 includes heating the high aspect ratio features after hydrogen or deuterium radical species exposure at a temperature of about 400° C. to about 1100° C. In some embodiments, which can be combined with other embodiments described herein, the high aspect ratio features are heated in a second processing volume 358 of a second processing chamber 352, as depicted in FIG. 3. Alternatively, high aspect ratio features are heated in the first processing volume 308 of the first processing chamber 328.

FIG. 3 depicts a schematic of an example thermal processing system used to treat a channel structure 160A, 160B on a substrate in accordance with certain aspects of the present disclosure. The second processing chamber 352, can be a thermal processing chamber that can be heated at a temperature range from room temperature to about 1100° C. or greater, such as a furnace. In some embodiments, which can be combined with other embodiments, the substrate having high aspect ratio features is heated in the second processing chamber at a temperature of about 400° C. to about 1100° C., such as about 600° C. to about 1000° C., such as about 700° C. The substrate having high aspect ratio features is annealed in the second processing chamber 352 for at least about 1 minute, such as about 10 minutes to about 1 hour, such as about 20 minutes to 40 minutes, such as about 30 minutes. In at least one embodiment which may be combined with other embodiments, the second processing chamber 352 is operated at a pressure of about 1 Torr to about 3800 Torr, such as atmospheric or reduced pressure, such as about 1 Torr to about 760 Torr.

FIG. 4A depicts a schematic of an example thermal pre-processing system 400 used to treat a channel structure 160 on a substrate 100 in accordance with certain aspects of the present disclosure. The thermal pre-processing system 400 includes a first thermal processing chamber 328, a remote plasma source (RPS) 306, and a gas line 307 coupling the remote plasma source 306 to the first thermal processing chamber 328. The first thermal processing chamber 328 can be a conventional heater based anneal chamber, or a rapid thermal processing (RTP) chamber, such as a rapid thermal anneal (RTA) chamber. In some embodiments, the first thermal processing chamber 328 can be any thermal processing chamber where delivery of at least metastable radical molecular species and/or radical atomic species to a processing volume is desired. For example, in some embodiments, the processing chamber is a plasma treatment chamber, or a plasma enhanced or plasma assisted deposition chamber, such as a plasma enhanced chemical vapor deposition (PECVD) chamber or a plasma enhanced atomic layer deposition chamber (PEALD).

A control module 318 can be coupled to the thermal pre-processing system 400 to control the operating parameters of the first thermal processing volume 308, the RPS 306, the pump 316, and the gas flow in the gas line 307 to the first thermal processing chamber 328. The control module 318 can include a central processing unit (CPU) 324, a memory 320, and support circuits 322 for the CPU 324. The control module 318 controls the thermal pre-process system 300 directly, or via other computers and/or controllers (not shown) coupled to the first thermal processing chamber 328, the RPS 306, and/or the gas line 307. The control module 318 is of any form of a general-purpose computer processor that is used in an industrial setting for controlling various chambers and equipment, and sub-processors thereon or therein. The memory 320, or computer-readable medium, is one or more of readily available memory such as random access memory (RAM), read only memory (ROM), floppy disk, hard disk, flash drive, or any other form of digital storage, local or remote. The support circuits 322 are coupled to the CPU 324 for supporting the processor. The support circuits 322 include cache, power supplies, clock circuits, input/output circuitry and subsystems, and the like. Substrate processing parameters are stored in the memory 320 as a software routine that is executed or invoked to turn the control module 318 into a specific purpose controller to control the operations of the thermal pre-processing system 300. The control module 318 is configured to perform any of the methods described herein. In some embodiments, a vacuum pump 316 is used to maintain a gas pressure in the first thermal processing volume 308. The vacuum pump 316 evacuates post-processing gases and/or by-products of the process via an exhaust 309. In some embodiments, the vacuum pump 316 is controlled by the control module 318.

The RPS 306 is coupled to a power supply 338. The power supply 338 is used as an excitation source to ignite and maintain a plasma in the RPS 306. In at least one embodiment, the RPS 306 includes an inductively coupled plasma (ICP) source, a transformer coupled plasma (TCP) source, and/or a capacitively coupled plasma (CCP) source. In some embodiments which may be combined with other embodiments, the power supply 338 is a radio frequency (RF) source. For example, the RF source delivers power between about a 5 kW to about 9 kW, such as a 7 kW.

The RPS 306 operates at about 50 mT to about 10 T, such as about 100 mT to about 1 T. The RPS 306 is coupled to a first gas source 302 via first gas conduit 303 and a second gas source 304 via second gas conduit 305. For example, the first gas source 302 can include a first gas, the first gas can include a nonreactive gas such as He, Ne, Ar, Kr, Xe, and $N_2$. For example, the first gas source 302 can include Ar gas. In some embodiments, the second gas source 304 can include a hydrogen, nitrogen, or deuterium containing species, $H_2$, $D_2$, $NH_3$ or a combination thereof. In at least one embodiment, the thermal pre-processing system includes two chambers set forth in FIG. 4B. The flow rate of the second gas source into the first thermal processing volume 308 is about 10 sccm to about 5000 sccm, such as from about 100 sccm to about 1500 sccm. The total flow rate of the first and second gas into the first thermal processing volume 308 is about 10 sccm to about 5000 sccm, such as from about 100 sccm to about 1500 sccm.

FIG. 4B depicts a cross-sectional view of an example thermal pre-processing system 400 having a two chambers in accordance with certain aspects of the present disclosure. In particular, FIG. 4B depicts an example of a first thermal processing chamber having two thermal processing chambers 328A, 328B. Each of the thermal processing chambers 328A, 328B of the first thermal processing system 400 includes a substrate holder 312A, 312B. The substrates having high aspect ratio features are positioned on one of the substrate holders (e.g., 312A, 312B) in one of the first processing volumes (e.g., 308A, 308B).

Each of the thermal processing chambers 328A, 328B includes remote plasma sources 306A, 306B. In some embodiments, the thermal processing chambers 328A, 328B can share a single RPS (not shown in figure). In some embodiments, each RPS 306A, 306B is coupled to a shared first gas source 302 and a shared second gas source 304. In at least one embodiment, each RPS 306A, 306B can be coupled to a distinct first gas source (not shown) and a distinct second gas source (not shown). Each of the substrate holders 312A, 312B has embedded heater elements 314A, 314B suitable for controlling the temperature of the substrate supported on the substrate holders 312A, 312B. In at least one embodiment which may be combined with other embodiments, the substrate holder 312A, 312B can be resistively heated by applying an electric current from a power supply to the heater element 314A, 314B. Each of the thermal processing chambers 328A, 328B also includes process kits 310A, 310B. A process kit is one or more components inside the thermal processing chambers 328A, 328B used for on-wafer performance, such as liners. The liners can be made from quartz, ceramic, or metal.

Figure 5:
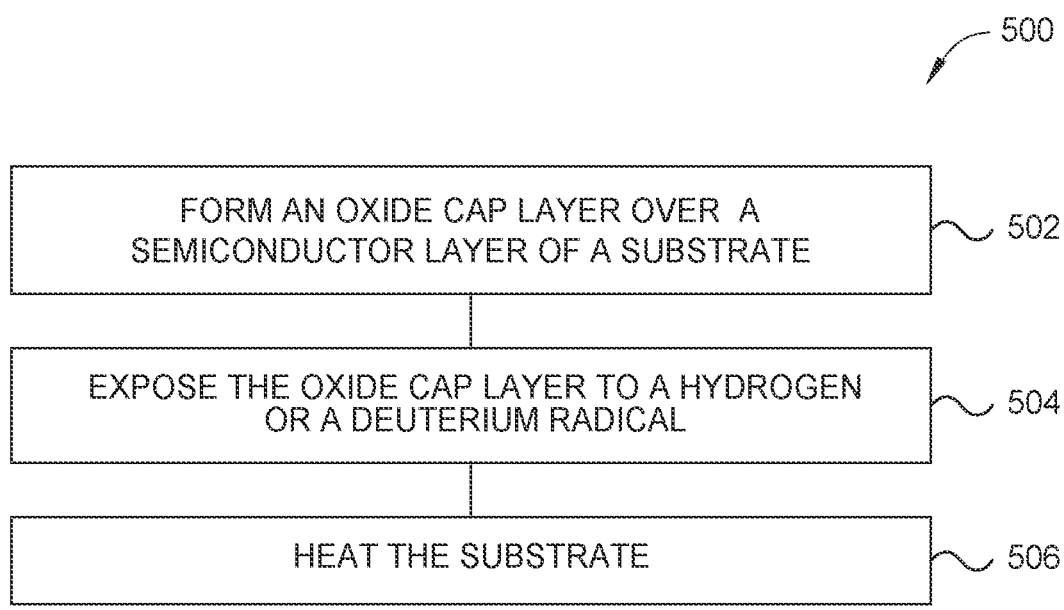
FIG. 5 depicts a flow diagram of an example method of processing a substrate having high aspect ratio features in accordance with certain aspects of the present disclosure.

FIG. 5 depicts a flow diagram of an example method 500 of processing a substrate having high aspect ratio features in accordance with certain aspects of the present disclosure. The high aspect ratio features have aspect ratios of greater than about 20:1, such as from about 20:1 to about 1000:1, such as from about 50:1 to about 500:1, such as from about 100:1 to about 300:1. The method 500 includes, at operation 502, forming an oxide cap layer over a semiconductor layer (e.g., semiconductor channel layer 170), such a silicon-containing layer over a substrate. The substrate with the semiconductor layer is positioned in a first thermal processing chamber having a first processing volume, the first processing being in fluid communication with a gas line. The oxygen plasma is produced by any of the plasma sources described herein, such as by RPS, ICP, or microwave. In some embodiments, the oxygen plasma treatment provides an oxide cap layer 171 over the channel layer 170. The resulting channel layer 170 is substantially free of oxidation, as observed under transmission electron microscopy (TEM).

The oxide cap layer 171 is formed by exposing the semiconductor layer 170 of the substrate in the processing volume 308 to the oxygen plasma produced from the remote plasma source 306. The oxygen cap layer formed in operation 502 provides a protective layer prior to operation 504.

At operation 504, the oxide cap layer of the substrate is exposed to a hydrogen or deuterium radical species. Forming the hydrogen or deuterium radical species includes forming a plasma from a first gas in a remote plasma source 306, flowing the plasma into the first thermal processing chamber 328 via gas line 307, and flowing a second gas to the remote plasma source 306 prior to, simultaneously with, or after ignition of the first gas in the remote plasma source 306. In some embodiments, the plasma and the second gas can mix in the first thermal processing volume 308. The first gas from the first gas source 302, such as argon, flows into the remote plasma source 306 via first gas conduit 303. The power supply 338 is turned on and the mixture in remote plasma source 306 flows into the first thermal processing volume 308. The second gas, such as hydrogen gas, enters the RPS 306 via the second gas conduit 305, mixes with the plasma, and flows to the first thermal processing volume 308 via the gas line 307. The flow rate of the second gas is about 5% to about 100% of the total flow rate of the first and second gas to the remote plasma source 306. The first gas is ignited into plasma in the RPS 306 and used to dissociate the molecules of the second gas into a radical species, such as hydrogen radical in the remote plasma source and in a mixing volume of the gas line 307. In some embodiments which may be combined with other embodiments, the first gas can be turned off and the radical species produced from the second gas can flow into the first thermal processing volume 308. In some embodiments which may be combined with other embodiments, the first gas can continue to flow into the first thermal processing volume concurrently with the radical species produced from the second gas. The hydrogen-or-deuterium radical species is flowed into the first thermal processing volume 308 to nucleate the amorphous layer of the 3D memory structures of the substrate with the radical species as described in operation 506.

Although the plasma source is depicted in the figures as a remote plasma source 306, other excitation sources are contemplated. In some embodiments, which can be combined with other embodiments described herein, the second gas flows into an inductively coupled plasma (ICP) source before flowing into the first thermal processing volume or the second gas is energized by ICP in situ within the first thermal processing volume. In some embodiments, the second gas can flow into a microwave plasma source before flowing into the first thermal processing volume or the second gas is energized by the microwave plasma source in situ within the first thermal processing volume. In some embodiments which may be combined with other embodiments, the thermal process of the present disclosure is free of all non-hydrogen and/or non-deuterium radical species.

Without being bound by theory, it is believed that certain radical species such as hydrogen or deuterium radicals react with semiconductor atoms (e.g., of the semiconductor layer) to form a volatile hydrogen and silicon compound that can etch portions of the semiconductor layer. It has been discovered that forming an oxide cap layer 171 over the semiconductor layer (e.g., a semiconductor channel layer 170) reduces etching of the semiconductor channel layer 170 by reducing the silicon and hydrogen interaction (which would otherwise occur in operation 504 in the absence of oxide cap layer 171).

In certain aspects of the present disclosure which may be combined with other embodiments, forming the hydrogen or deuterium radical species, includes turning on the power supply 338 to the RPS 306 and flowing the second gas from a second gas source 304, such as hydrogen-containing gas, into the RPS 306 via second gas conduit 305. The flow rate of the second gas can be about 100% of the total gas flow rate to the remote plasma source 306. The molecules of the second gas are dissociated to a radical species, such as hydrogen radical, in remote plasma source 306 and in the gas line 307. The hydrogen or deuterium radical species is flowed into the first thermal processing volume 308 as described in operation 504.

Flowing the hydrogen and/or deuterium radical species to the first thermal processing volume 308 includes nucleating the semiconductor channel layer 170. In particular, before the hydrogen and/or deuterium radical species treatment, the semiconductor channel layer is an amorphous layer, such as an amorphous layer and/or semi-crystalline layer used to produce 3D memory structures. After exposing the substrate having the amorphous semiconductor channel layer, the semiconductor (e.g., silicon) within the channel layer 170 is nucleated to form a nucleated substrate. Nucleating the substrate includes heating the substrate during the hydrogen and/or deuterium radical species exposure.

In some embodiments, the substrate in the first processing chamber (e.g., 328 shown in FIG. 4A and FIG. 4B) is heated at a temperature of about 100° C. to about 1100° C., such as about 400° C. to about 1100° C., such as about 200° C. to about 800° C., such as about 300° C. to about 700° C., about 400° C. to about 600° C., such as about 500° C. In at least one embodiment, the substrate having high aspect features, is exposed to the hydrogen and/or deuterium radical species at about 400° C. to about 600° C. for about 1 minute to about 60 minutes, such as about 5 minutes to about 20 minutes, such as about 5 minutes to about 10 minutes, or from about 10 minutes to about 15 minutes. The oxide cap layer 171 deposited over the semiconductor channel layer 170 described herein, reduces hydrogen or deuterium outgas that can occur during heating of the substrate. It has been discovered that semiconductor channel layers 170 having higher purity of the semiconductor (e.g., silicon) benefits from the oxide cap layer 171 more than semiconductor channel layers 170 having other dopants such as hydrogen dopants prior to the hydrogen or deuterium radical treatment. Without being bound by theory, preventing outgassing of hydrogen or deuterium in the channel layer 170 provides greater grain growth within the channel layer 170.

The flow rate of hydrogen or deuterium radical species into the first thermal processing volume 308 is about 10 sccm to about 5000 sccm, such as from about 100 sccm to about 1500 sccm. The total flow rate of gas including the radical species into the first thermal processing volume 308 is about 10 sccm to about 5000 sccm, such as from about 100 sccm to about 1500 sccm. The temperature of the first thermal processing chamber is at about 100° C. to about 1100° C. In at least one embodiment, the substrate having high aspect ratio features is treated with the radical species at about 450° C. to about 550° C. for about 5 minutes to about 10 minutes.

The pressure in the first thermal processing chamber is at least about 10 mTorr to about 530 Torr, such as about 10 mTorr to about 10 Torr. Pressure in the first thermal processing chamber is controlled by increasing the gas flow rate from the gas line to the first thermal processing chamber and/or decreasing the gas flow rate pumped out of the first thermal processing chamber. An increased amount of inert gas in the first thermal processing increases the chamber pressure in the first thermal processing chamber which can absorb the radical species in the thermal processing chamber and cause the radical species to combine. Under certain conditions, this reduces etching of the channel layer of the channel structure caused by high amounts of hydrogen and/or deuterium radical species.

Without being bound by theory, it is believed that treating the amorphous or polycrystalline semiconductor material of the semiconductor channel layer 170 with a radical species such as hydrogen and/or deuterium radicals, can lower the activation energy required for nucleation and grain growth of the semiconductor material. In particular, it is believed that the radical inserts into the semiconductor lattice structure of the semiconductor channel layer 170 (e.g., through the oxide cap layer 171 by thermal diffusion) and creates "seeds" for grain growth and can increase crystallinity of the semiconductor material during annealing. The insertion of the hydrogen or deuterium radical species can cause semiconductor atom bonds, such as Si—Si bonds, to break/relax and rearrange. These rearrangements can reduce the activation energy for nucleation and thus reduce the amount of heat that typically required to crystallize the material. It has been discovered that using high temperatures of about 400° C. to about 1100° C., such as 400° C. to about 600° C. during radical annealing results in good semiconductor grain growth for several reasons. First, high temperatures will increase dis-absorption efficiency of H radical on semiconductor surface, therefore, minimize etching of semiconductor caused by the radical species. Without being bound by theory, it is believed that the radical species (e.g., hydrogen and/or deuterium) can react with semiconductor atoms to form a volatile hydrogen, semiconductor compound (e.g., silicon compound) that can etch the semiconductor channel layer 170 (e.g., Si layer), at high temperatures, dis-absorption of radicals such as hydrogen radicals is increased so that the radicals do not have time to react with the semiconductor material before leaving the surface of the semiconductor material. Second, using high temperatures during radical annealing can increase both diffusion coefficient and diffusion length for the hydrogen or deuterium radical species to diffuse into the semiconductor layer, therefore increasing the efficiency of nucleation inside the amorphous semiconductor layer. Third, high temperature during annealing provides more thermal energy for semiconductor atoms to move and rearrange themselves into crystalline structures. Silicon, germanium, germanium alloys, silicon alloys, and a combination thereof benefit similarly. The oxide cap layer 171 described herein provides a barrier layer that reduces the rate of hydrogen or deuterium radical species diffusion into the semiconductor layer and also reduces the rate of diffusion of the hydrogen or deuterium radical species out of the semiconductor layer during subsequent heating as described below with respect to operation 506.

The method 500 can optionally include, at operation 506, heating the nucleated substrate in the first processing volume or a second thermal processing chamber having a second processing volume. The second thermal processing chamber is an oven or a furnace, such as a large industrial furnace, a box furnace, a split box furnace, a tube furnace, a split tube furnace, a multi-zone split tube furnace, and/or a small batch furnace. In some embodiments, which can be combined with any of the embodiments of the present disclosure, the second thermal processing chamber is the same as the first thermal processing chamber. For example, the radical species treatment of operation 506 of method 500 occur in the same chamber as heating in operation 504. Heating the substrate in the second processing volume enables heating several substrates simultaneously, allowing additional substrates to be processed in the first processing chamber and therefore increasing overall process throughput.

The nucleated substrate having high aspect ratio features is heated in the second processing chamber at a temperature of about 300° C. to about 1100° C., such as about 600° C. to about 800° C., such as about 700° C. As used herein, the term "nucleated substrate," refers to a substrate that has been treated with a hydrogen or deuterium radical species to form nucleation sites. A nucleation site is a site upon which additional atoms are deposited as the crystal grows to form a structure pattern characteristic of a crystalline solid. A nucleated substrate can be partially crystallized or fully crystalized depending on the degree of crystallization introduced by the treatment.

The nucleated substrate having high aspect ratio features is annealed in the second processing chamber 352 for at least about 1 minute, such as about 10 minutes to about 1 hour, such as about 20 minutes to 40 minutes, such as about 30 minutes. In at least one embodiment, the second processing chamber can be operated at atmospheric or reduced pressure, such as about 1 Torr to about 760 Torr. In some embodiments which may be combined with other embodiments, operation 508 can occur in the first thermal processing volume 308. In some embodiments, the first thermal processing volume 308 can be evacuated via pump 316 of gases and the nucleated substrate can be heated in the first thermal processing volume. The total processing time from operation 502 to operation 508 is less than about 2.5 hours, such as about 1 hour to about 2 hours, such as about 1.5 hours. In some embodiments, operation 504 and 506 can occur in the first processing chamber and the total processing time of operations 504 and 506 can be at least about 1 minute, such as about 10 minutes to about 1 hour, such as about 20 minutes to 40 minutes, such as about 30 minutes.

The oxide cap layer 171 reduces the overall hydrogen or deuterium concentration in the resulting channel layer 170 after the hydrogen or deuterium radical treatment (e.g., operation 504) and before annealing the substrate (e.g., operation 506). Despite having a reduced overall hydrogen or deuterium concentration in the channel structure 160B having an oxide cap layer 171 when compared to a channel structure 160A without the oxide cap layer 171 prior to heating, the overall concentration of hydrogen and deuterium in channel structure 160B is increased after the heating operation (e.g., operation 506) relative to channel structure 160A. Without being bound by theory it is believed that the outgassing of hydrogen or deuterium is reduced in the channel structure 106B during the heating operation 506, which results in higher hydrogen or deuterium atom concentration. In some embodiments, which can be combined with other embodiments described herein, a lower temperature such as about 100° C. to about 400° C., such as about 300° C. is selected for operation 506 for an increased hydrogen concentration in the channel layer 170.

According to at least one embodiment which may be combined with other embodiments, one or more operations of the methods described above may be included as instructions in a computer-readable medium for execution by a control unit (e.g., controller module) or any other processing system. The computer-readable medium can include any suitable memory for storing instructions, such as random access memory (RAM), read only memory (ROM), floppy disk, hard disk, flash drive, or any other form of digital storage, local or remote. As an example, and in some aspects of the present disclosure, a system programmed to perform a method including an algorithm stored in a memory of the system is provided. The algorithm can have a number of instructions which, when executed by a processor, causes a method to be performed. The method can include positioning the substrate in a first processing chamber having a first processing volume, the first processing volume being in fluid communication with a gas line and the substrate having high aspect ratio features having aspect ratios of greater than about 20:1, such as from about 20:1 to about 1000:1, such as from about 50:1 to about 500:1, such as from about 100:1 to about 300:1. The method 500 can further include forming a radical species in the remote plasma source and exposing the substrate to the radical species in the first processing chamber to form a nucleated substrate. The nucleated substrate can be positioned in a second processing chamber having a second processing volume and the substrate can be heated in the second processing chamber at, e.g., a temperature higher or lower than the temperature of the first processing chamber.

The invention claimed is:

1. A method of processing a substrate, comprising:
positioning the substrate in a first processing chamber comprising a first processing volume, the substrate comprising a channel structure with high aspect ratio features having aspect ratios greater than about 20:1;
exposing a silicon-containing layer of the channel structure to an oxygen plasma to form an oxide cap layer, the silicon-containing layer having a silicon-containing layer thickness and the oxide cap layer having an oxide cap layer thickness, wherein the oxide cap layer thickness is about 10% to about 50% of the silicon-containing layer thickness;
exposing the oxide cap layer of the channel structure to a hydrogen-or-deuterium plasma in the first processing volume; and
heating the substrate at a temperature of about 100° C. to about 1100° C. to form a nucleated substrate.

2. The method of claim 1, wherein the hydrogen-or-deuterium plasma is formed from a hydrogen-or-deuterium containing gas in a remote plasma source.

3. The method of claim 2, wherein:
the hydrogen-or-deuterium containing gas comprises a He, Ne, Ar, Kr, Xe, $N_2$, or a combination thereof; and
a hydrogen-or-deuterium containing gas, $H_2$, $D_2$, $NH_3$, or a combination thereof.

4. The method of claim 1, further comprising positioning the nucleated substrate in a second processing chamber comprising a second processing volume; and
heating the nucleated substrate in the second processing chamber.

5. The method of claim 4, wherein the nucleated substrate is heated at a temperature of about 400° C. to about 1100° C. for about 10 minutes to about 2 hours, at a pressure of about 1 Torr to about 3800 Torr.

6. The method of claim 1, exposing the oxide cap layer to the hydrogen-or-deuterium plasma in the first processing volume comprises flowing the hydrogen-or-deuterium plasma into the first processing volume at a flow rate of about 10 sccm to about 5000 sccm.

7. The method of claim 1, wherein the heating the substrate heating the substrate in the first processing volume occurs for about 1 minute to about 30 minutes, at a pressure of about 10 mTorr to about 530 Torr.

8. The method of claim 1, wherein the hydrogen-or-deuterium plasma is formed using an inductively coupled plasma source.

9. A method of making a memory device on a substrate comprising:
forming a channel structure in a film stack by etching a channel hole in the film stack and placing a channel layer at a bottom and in an inner surface of the channel hole, the channel structure in the film stack forming high aspect ratio features on the substrate, the high aspect ratio features having aspect ratios greater than about 20:1;
forming an oxide layer over the channel layer of the channel structure by oxidizing a silicon-containing layer, the silicon-containing layer having a silicon-containing layer thickness and the oxide layer having an oxide layer thickness, wherein the oxide layer thickness is about 10% to about 50% of the silicon-containing layer thickness;
exposing the channel structure comprising the oxide layer with hydrogen radicals in a first processing volume of a first processing chamber; and heating the high aspect ratio features at a temperature of about 100° C. to about 1100° C.

10. The method of claim 9, wherein exposing the high aspect ratio features to hydrogen radicals and heating the high aspect ratio features comprises heating the high aspect ratio features in the first processing volume at a temperature of about 400° C. to about 1100° C. for about 1 minute to about 30 minutes.

11. The method of claim 9, further comprising heating the high aspect ratio features at a temperature of about 400° C. to about 1100° C. in a second process volume.

12. The method of claim 9, wherein the film stack is a 3D NAND film stack, and the channel layer is an amorphous or polycrystalline layer comprising from about 0 wt. % to about 100 wt. % of silicon and about 0 wt. % to about 100 wt. % of a group III, IV and V element.

13. The method of claim 9, further comprising forming the film stack, wherein forming the film stack comprises depositing alternating oxide layers and nitride layers, or alternating oxide layers and polysilicon layers.

14. A method of processing a substrate comprising:
forming a silicon-containing layer over a substrate;
forming an oxide cap layer over the silicon-containing layer by exposing the silicon-containing layer to an oxygen plasma, the silicon-containing layer having a silicon-containing layer thickness and the oxide cap layer having an oxide cap layer thickness, wherein the oxide cap layer thickness is about 10% to about 50% of the silicon-containing layer thickness;
exposing the oxide cap layer to hydrogen radicals;
heating the substrate at a first temperature of about 100° C. to about 1100° C. to form a nucleated silicon-containing layer of the substrate; and
heating the nucleated silicon-containing layer at a second temperature.

15. The method of claim 14, wherein the oxide cap layer has a thickness of about 2 Å to about 30 Å.

16. The method of claim 14, wherein forming the oxide cap layer comprises positioning the substrate in a first processing volume of a first processing chamber and wherein exposing the oxide cap layer with the hydrogen radicals comprises dissociating hydrogen in the first process volume.

17. The method of claim 14, wherein the substrate comprises high aspect ratio features having aspect ratios greater than about 20:1.

18. The method of claim 14, wherein forming the oxide cap layer comprises flowing an oxygen plasma comprising the oxygen plasma into a first processing volume comprising the substrate at an oxygen plasma flow rate of about 0.05 SLM to about 10 SLM.

* * * * *